US009010194B2

(12) United States Patent
Chiou

(10) Patent No.: US 9,010,194 B2
(45) Date of Patent: Apr. 21, 2015

(54) PRESSURE SENSOR WITH INTERCONNECTOR HAVING A COMPLIANT PIN ASSEMBLY

(75) Inventor: Jen-Huang Albert Chiou, Libertyville, IL (US)

(73) Assignee: Continental Automotive Systems, Inc, Auburn Hills, MI (US)

( * ) Notice: Subject to any disclaimer, the term of this patent is extended or adjusted under 35 U.S.C. 154(b) by 239 days.

(21) Appl. No.: 13/538,599

(22) Filed: Jun. 29, 2012

(65) Prior Publication Data

US 2013/0160562 A1 Jun. 27, 2013

Related U.S. Application Data

(60) Provisional application No. 61/555,135, filed on Nov. 3, 2011.

(51) Int. Cl.
*G01L 1/00* (2006.01)
*H01R 12/51* (2011.01)
*H01R 12/58* (2011.01)
*G01L 19/00* (2006.01)
*G01L 19/14* (2006.01)

(52) U.S. Cl.
CPC ............... *G01L 1/005* (2013.01); *H01R 12/51* (2013.01); *H01R 12/585* (2013.01); *G01L 19/0084* (2013.01); *G01L 19/148* (2013.01)

(58) Field of Classification Search
CPC ....... G01L 1/005; H01R 12/585; H01R 12/51
See application file for complete search history.

(56) References Cited

U.S. PATENT DOCUMENTS

2013/0031984 A1\* 2/2013 Jones et al. ..................... 73/717

FOREIGN PATENT DOCUMENTS

| JP | 10221194 A | 8/1998 |
| JP | 2004163321 A | 6/2004 |

OTHER PUBLICATIONS

Search Report dated May 16, 2012, from corresponding GB Patent Application No. 1201429.6.

\* cited by examiner

*Primary Examiner* — Lisa Caputo
*Assistant Examiner* — Brandi N Hopkins

(57) ABSTRACT

A pin and circuit board assembly includes at least three pins (24', 24"). Each pin includes a first end (35) and a second end (37). All of the first ends of the pins are arranged on a common plane. The second ends of at least two of the pins are disposed on the common plane and a second end of at least one of the pins, other than the two pins, are disposed on a second plane that is offset from the common plane. The second end of each pin is spaced apart from a second end of another pin substantially at an angle of 360/N, where N is the total number of pins. A printed circuit board (22') includes at least three pin holes (28', 28"), each arranged to receive a second end of an associated pin in a press-fit arrangement. The assembly avoids tilting of the PCB upon inserting the pins.

8 Claims, 5 Drawing Sheets

PRESSURE SENSOR WITH INTERCONNECTOR HAVING A COMPLIANT PIN ASSEMBLY

CROSS-REFERENCE TO RELATED APPLICATIONS

This application is a non-provisional of, and claims priority to, U.S. Provisional Application Ser. No. 61/555,135, filed Nov. 3, 2011, entitled Pressure Sensor with Interconnector Having a Compliant Pin Assembly, which is incorporated herein by reference.

FIELD

This invention relates high pressure sensors for automotive applications and, more particularly, to a gasoline or diesel direct injection sensor having a compliant pin interconnect and assembly to reduce vibration on bonding wires.

BACKGROUND

With reference to FIGS. 1 and 2, a conventional high pressure sensor is shown, generally indicated at 10. FIG. 2 is an enlarged cross-sectional view of the housing 12 of FIG. 1. Thus, the housing 12 houses a portion of a metal fuel port 14. A pressure sensing element 16 is mounted on an end of the port 14. The sensing element 16 is connected to an application-specific integrated circuit (ASIC) 18 by bonding wires 20. The ASIC 18 is connected to bond pad 31 on a printed circuit board (PCB) 22 by bonding wires 21. The ASIC 18 is mounted on the PCB 22 that is adhered to a spacer 23. Compliant pins 24 (typically three pins 24 not disposed on a single plane) are injection molded into a connector 26 to provide an input voltage, a ground, and an output voltage to the PCB 22.

FIG. 3 is a top view of the housing 12, shown with the pins 24 ready to be inserted into pin holes 28 in the PCB 22. With reference to FIG. 4, which is a side view of the pins 24 coupled with the PCB 22, since the pin holes 28 and thus the pins 24 inserted therein are on the same side of the PCB 22, the pins 24 can tilt during assembly. FIG. 5 shows the assembly forces on the PCB 22 during insertion of the pins 24. Since the modulus of the adhesive 30 is low, when one side of the adhesive 30 is under tension and the other side thereof is under compression, the PCB 22 is tilted.

In addition, with reference to FIGS. 4 and 6, vibrating force from portion of a cable (not shown) and the connector 26 that is transferred to the pins 24 can also tilt PCB 22 up and down. As shown in FIG. 7, in the conventional sensor 10, the sensing element 16 is mounted to the port 14 via a first bonding material or glass frit 32 and the ASIC 18 is mounted to the PCB 22 by a second bonding material or adhesive 34. The port 14 is provided in an opening 33 in the PCB 22. Vibration forces F from the cable coupled with the connector 26 can induce a high relative displacement between the port 14 and the PCB 22. Thus, vibration can cause the adhesive 34 and ASIC 18 to move up and down with PCB 22, while the glass frit 32 and the sensing element 16 remains more stationary. Such relative movement can cause the bonding wire 20 at either end thereof to be broken.

Thus, there is a need in a high pressure sensor to reduce assembly and vibration displacements on a PCB and thus make the bonding wire connection between an ASIC and pressure sensing element more robust.

SUMMARY OF THE INVENTION

An object of the invention is to fulfill the need referred to above. In accordance with the principles of the present invention, this objective is achieved by a pin and circuit board assembly including a pin assembly having at least three pins for carrying electric current. Each pin includes a solid first end and a second end configured for press-fitting into a printed circuit board (PCB). All of the first ends of the pins are arranged on a common plane. The second ends of at least two of the pins are disposed on the common plane and a second end of at least one of the pins, other than the two pins, is disposed on a second plane that is offset from the common plane. The second end of each pin is spaced apart from a second end of another pin substantially at an angle of 360/N, where N is the total number of pins. A printed circuit board includes at least three pin holes that are disposed apart substantially at the angle of 360/N. Each pin hole receives a second end of an associated pin in a press-fit arrangement. The assembly avoids tilting of the PCB upon inserting the pins.

In accordance with another aspect of an embodiment, a high pressure sensor includes the pin and circuit board assembly as described above, along with an application-specific integrated circuit (ASIC) mounted on the PCB, a fuel port having an end disposed in an opening in the PCB, a pressure sensing element mounted on the end of the fuel port, and bonding wires connecting the sensing element to the ASIC.

In accordance with yet another aspect of an embodiment, a method is provided for reducing vibration on bonding wires provided between a pressure sensing element and an application-specific integrated circuit (ASIC) of a high pressure sensor. The method provides a plurality pins for carrying electric current. Each pin includes a first end and a second end. All of the first ends of the pins are arranged on a common plane. A second end of at least some of the pins is disposed on the common plane while a second end of at least another of the pins is disposed on a second plane that is offset from the common plane. A printed circuit board (PCB) is provided and includes pin holes. Each pin hole is disposed for receiving a second end of an associated pin. The method ensures that the pin holes and the second ends of the associated pins are oriented so that a force of inserting the second ends of the pins into the pin holes is substantially uniformly applied on the PCB. The second ends of the pins are press-fitted into the pin holes of the PCB, thereby applying a uniform force on the PCB so that substantially no tilting of the PCB occurs during assembling the pins to the PCB.

Other objects, features and characteristics of the present invention, as well as the methods of operation and the functions of the related elements of the structure, the combination of parts and economics of manufacture will become more apparent upon consideration of the following detailed description and appended claims with reference to the accompanying drawings, all of which form a part of this specification.

BRIEF DESCRIPTION OF THE DRAWINGS

The invention will be better understood from the following detailed description of the preferred embodiments thereof, taken in conjunction with the accompanying drawings, wherein like reference numerals refer to like parts, in which.

DETAILED DESCRIPTION OF EXEMPLARY EMBODIMENTS

Figure 1:
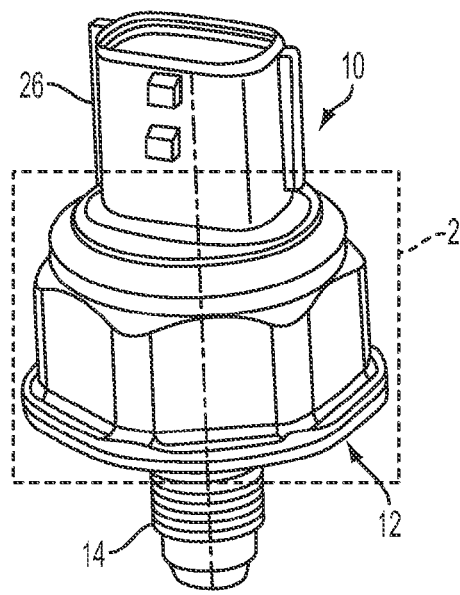
FIG. 1 is a view of a conventional high pressure sensor.
Figure 2:
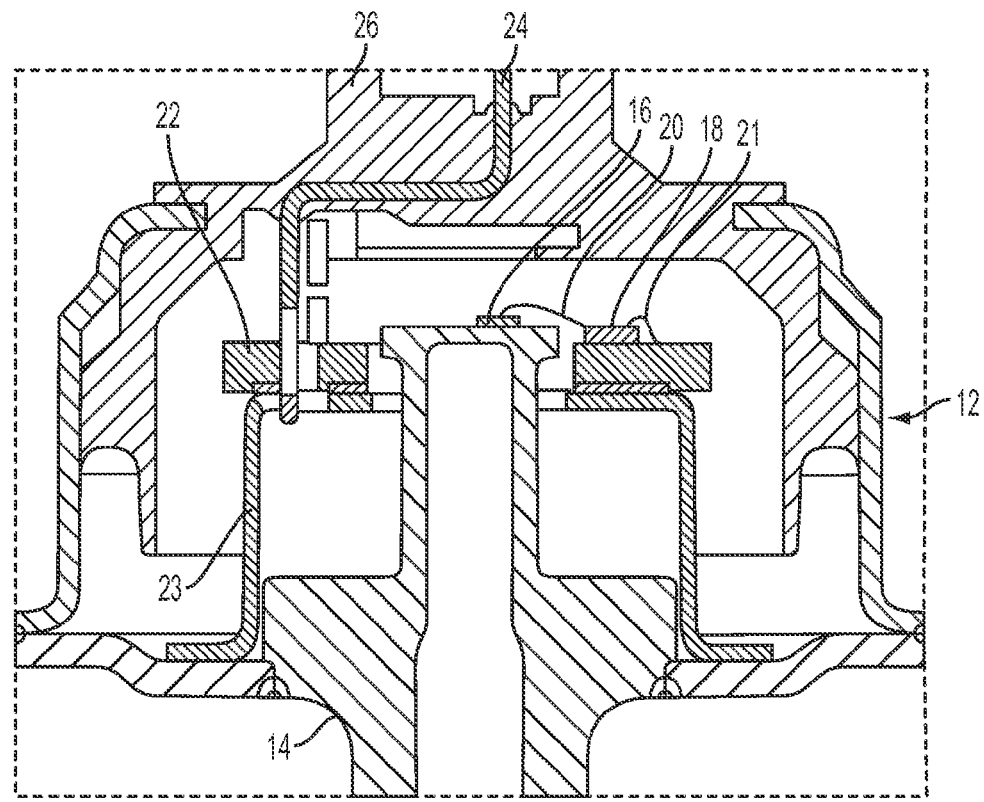
FIG. 2 is an enlarged cross-sectional view of the housing enclosed at 2 in FIG. 1.
Figure 8:
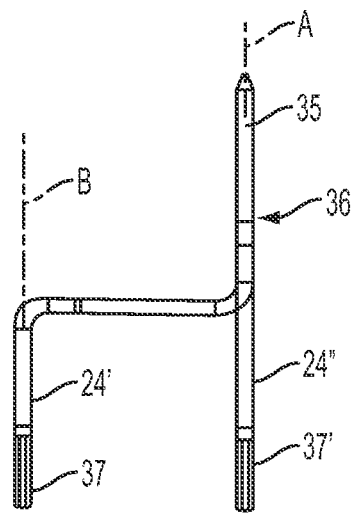
FIG. 8 is a side view of a pins assembly of a high pressure sensor, provided in accordance with an embodiment.
Figure 9:
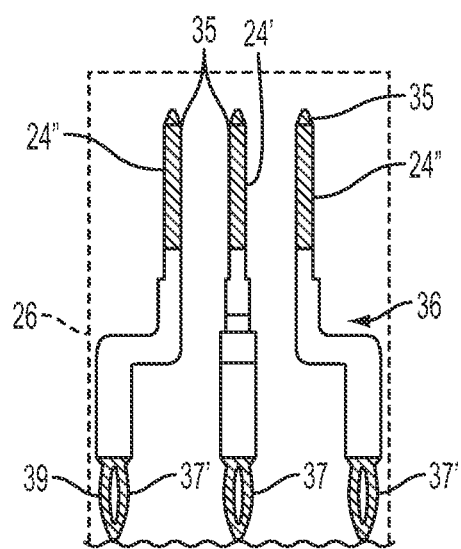
FIG. 9 is a front view of the pin assembly of FIG. 8.

With reference to FIG. 8, a side view of a pin assembly is shown, generally indicated at 36 in accordance with an embodiment of the invention. As shown, each pin 24', 24" includes a first solid end 35 and a second end 37 with a hole 39 or eyelet configured for press-fitting into a PCB. All of the first ends 35 are arranged on a common plane A. The pin assembly 36 comprises two pins 24" each having its second end 37' disposed on the common plane A and one pin 24' having its second end 37 disposed on a second plane B that is offset from the common plane A. The second ends 37, 37' of the pins 24', 24" are spaced apart at generally equal angles, for example at an angle of 360/N where N is the number of pins. In the embodiment, since three pins 24, 24" are provided, the second ends thereof are spaced approximately 120° apart. At least portions of the pins 24', 24" are molded into an electrical connector 26 (FIG. 1). FIG. 9 is a front view of the pin assembly 36. The pins 24', 24" are for carrying electric current to the PCB 22'.

Figure 3:
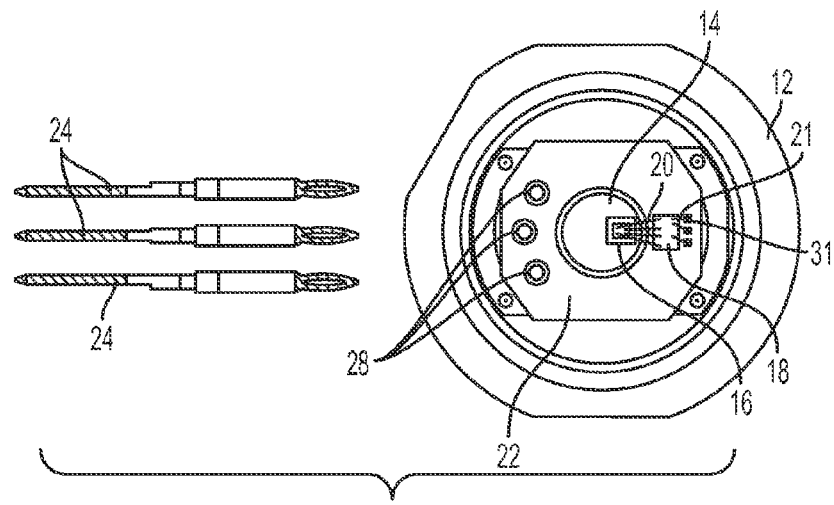
FIG. 3 is a top, internal view of the housing of the conventional high pressure sensor, with pins being ready to be inserted into a PCB.
Figure 4:
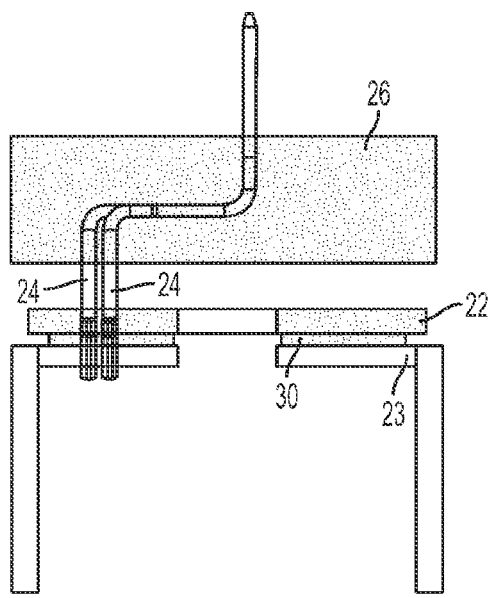
FIG. 4 is a side schematic view of a portion of the conventional high pressure sensor showing the pins connected to the PCB.
Figure 5:
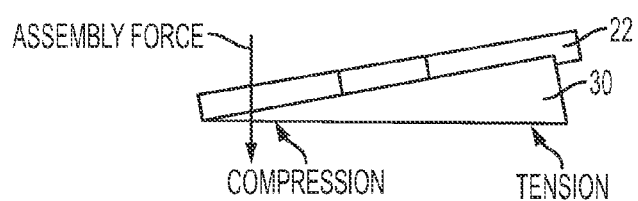
FIG. 5 is a view of the PCB and adhesive of FIG. 4 under assembly forces.
Figure 6:
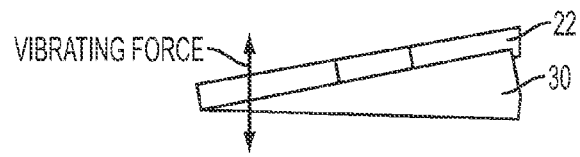
FIG. 6 is a view of the PCB and adhesive of FIG. 4 under vibration forces.
Figure 7:
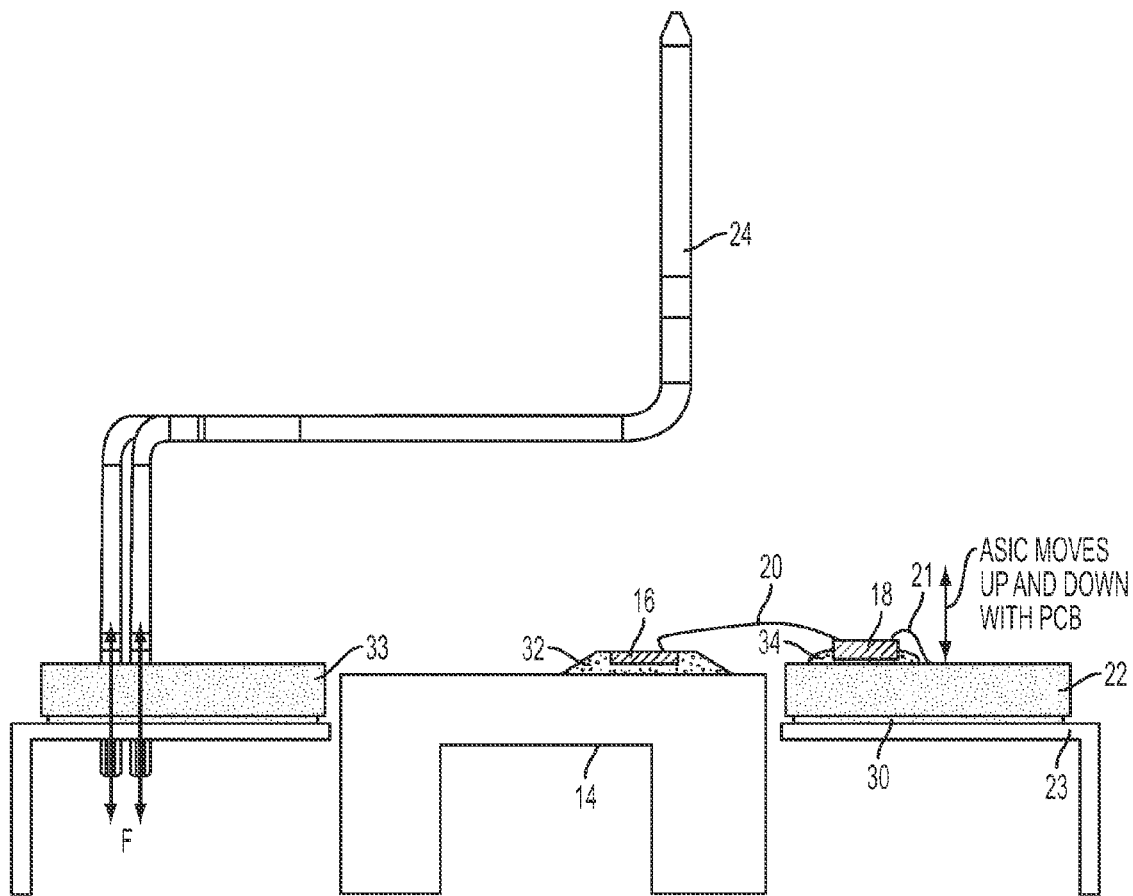
FIG. 7 is a side schematic view of the conventional high pressure sensor showing vibration forces on the PCB which causes relative motion between the ASIC and sensing element.
Figure 10:
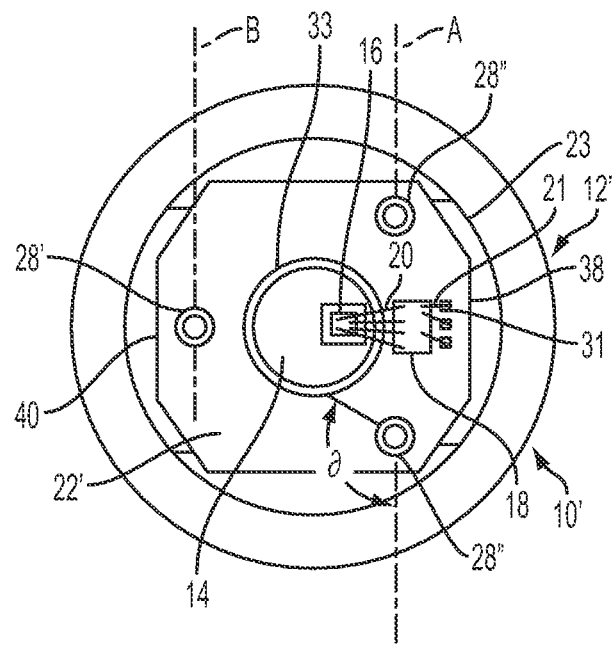
FIG. 10 is a top view of the a high pressure sensor of an embodiment, shown with the connector and the pins removed for clarity of illustrating the pin hole locations.

With reference to FIG. 10, the PCB 22' includes pin holes or vias 28', 28" for receiving the second ends 37, 37' of the pins 24', 24" for electrical connection therewith. The pin holes 28', 28" are disposed apart at an angle ∂, substantially equal to 360/N (120° in the embodiment). Pin holes 28" are disposed on the plane A near side 38 of the PCB 22' and pin hole 28' is disposed on the pane B, near side 40 of the PCB. Thus, ends 37' of pins 24" are press-fitted into an associated pin hole 28" and end 37 of pin 24' is press-fitted into pin hole 28'of the PCB 22' to define a pin and circuit board assembly. Since the pin hole 28' is disposed on an opposite side of the PCB as pin holes 28" (instead of all pin holes being on a single side of the PCB as in FIG. 3), during assembly of the pin assembly 36, a uniform force is exerted on the PCB 22', avoiding tilting motion of the conventional PCB 22 (described above).

As shown in FIG. 10, the pin assembly 36 is used in a high pressure sensor, generally indicated at 10'. The housing portion 12' houses a portion of the metal port 14 that extends through an opening 33 in the PCB 22'. The pressure sensing element 16 is provided on an end of the port 14. The sensing element 16 is connected to an application-specific integrated circuit (ASIC) 18 by typically four bonding wires 20. The ASIC 18 is provided on a printed circuit board (PCB) 22' that is adhered to the spacer 23. The pin assembly 36 provides power to the PCB 22'. The pin assembly 36 reduces pre-stress on the bonding wires 20 due to the uniform force distribution upon assembly. Still further, vibrational fatigue stress on the bonding wires 20 is reduced since the pin assembly 36 significantly reduces the PCB vibration, which reduces the oscillation of the ASIC 18 and thus avoids pulling the bonding wires 20 up and down.

Figure 11:
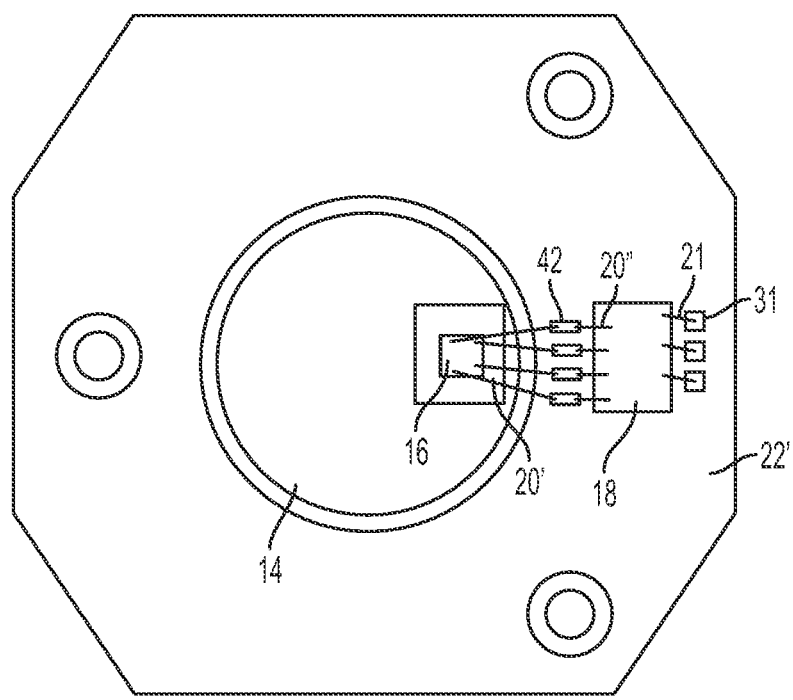
FIG. 11 is a top view of a portion of the high pressure sensor in accordance with another embodiment wherein a first set of bonding wires connects the sensing element to the PCB and another set of bonding wires connects the PCB to the ASIC.

As shown in FIG. 11, another embodiment of the assembly connects the pressure sensing element 16 to a bond pad 42 of the PCB 22' by a first set of bonding wires 20' with the PCB 22' being connected to the ASIC 18 by a shorter, second set of bonding wires 20".

Although the pin assembly 36 has been described for use in a high pressure sensor, it can be appreciated that the pin assembly can be used to connect with any circuit board requiring at least a three pin connection.

The foregoing preferred embodiments have been shown and described for the purposes of illustrating the structural and functional principles of the present invention, as well as illustrating the methods of employing the preferred embodiments and are subject to change without departing from such principles. Therefore, this invention includes all modifications encompassed within the scope of the following claims.

What is claimed is:

1. A pressure sensor comprising:
at least three pins for carrying electric current, each pin including a first end and a second end, all of the first ends of the pins being arranged on a common plane, the second ends of at least two of the pins being disposed on the common plane and a second end of at least one of the pins, other than the two pins, being disposed on a second plane that is offset from the common plane, the second end of each pin being spaced apart from a second end of another pin substantially at an angle of 360/N, where N is the total number of pins,
a printed circuit board (PCB) including at least three pin holes that are disposed apart substantially at the angle of 360/N, each pin hole receiving a second end of an associated pin in a press-fit arrangement,
an application-specific integrated circuit (ASIC) mounted on the PCB,
a fuel port having an end disposed in an opening in the PCB, and
a pressure sensing element mounted on the end of the fuel port.

2. The sensor of claim 1, wherein three pins are provided.

3. The sensor of claim 1, further comprising bonding wires connecting the sensing element to the ASIC.

4. The sensor of claim 1, further comprising bonding wires connecting the sensing element to the PCB and separate bonding wires connecting the PCB to the ASIC.

5. The sensor of claim 1, further comprising an electrical connector molded about at least a portion of each of the pins.

6. The pressure sensor of claim 1, wherein, for each of the at least three pins, the second end is different from, and opposite to, the first end.

7. The pressure sensor of claim 6, wherein each of the at least two pins that are disposed on the common plane has a longitudinal axis, an entirety of which is on the common plane.

8. The pressure sensor of claim 1, wherein at least one of the at least three pins is not straight.

* * * * *